United States Patent [19]
Arisumi et al.

[11] Patent Number: 5,886,385
[45] Date of Patent: Mar. 23, 1999

[54] SEMICONDUCTOR DEVICE AND MANUFACTURING METHOD THEREOF

[75] Inventors: Osamu Arisumi; Akira Nishiyama, both of Yokohama; Makoto Yoshimi, Setagaya-ku, all of Japan

[73] Assignee: Kabushiki Kaisha Toshiba, Kawasaka, Japan

[21] Appl. No.: 914,752

[22] Filed: Aug. 20, 1997

[30] Foreign Application Priority Data

Aug. 22, 1996 [JP] Japan ..................................... 8-221516
Jun. 24, 1997 [JP] Japan ..................................... 9-167368

[51] Int. Cl.$^6$ ............................. H01L 27/01; H01L 29/78
[52] U.S. Cl. ........................... 257/347; 257/67; 257/192; 257/194; 257/23
[58] Field of Search ..................................... 257/192, 194, 257/67, 23, 347

[56] References Cited

U.S. PATENT DOCUMENTS

| | | | |
|---|---|---|---|
| 4,447,823 | 5/1984 | Maeguchi et al. | 257/347 |
| 5,040,037 | 8/1991 | Yamaguchi et al. | 257/347 |
| 5,698,869 | 12/1997 | Yoshimi et al. | 257/347 |

FOREIGN PATENT DOCUMENTS

| | | |
|---|---|---|
| 61-15369 | 1/1986 | Japan . |
| 5-75120 | 3/1993 | Japan . |
| 7-302908 | 11/1995 | Japan . |

OTHER PUBLICATIONS

M. Chan et al., "Comparative Study of Fully Depleted and Body–Grounded Non Fully Depleted SOI MOSFET's for High Performance Analog and Mixed Signal Circuits", IEEE Trans. on Electron Devices, vol. 42, No. 11, Nov. 1995, pp. 1975–1981.

E. Ver Ploeg et al., "Elimination of Biopolar–Induced Breakdown in Fully–Depleted SOI MOSFETs", 1992 IEEE, pp. 13.1.1–13.1.4.

*Primary Examiner*—Peter Toby Brown
*Assistant Examiner*—Hung Van Duong
*Attorney, Agent, or Firm*—Foley & Lardner

[57] ABSTRACT

A semiconductor device comprises: a first semiconductor layer 6 having a first conductivity formed on a substrate having a surface of an insulating material 4; a source region 16a and a drain region 16b, which are formed on the first semiconductor layer so as to be separated from each other and which have a second conductivity different from the first conductivity; a channel region 6 formed on the first semiconductor layer between the source region and the drain region; a gate electrode 10 formed on the channel region a gate sidewall 14 of an insulating material formed on a side of the gate electrode; and a second semiconductor layer 18 having the first conductivity formed on at least the source region. This semiconductor device can effectively suppress the floating-body effect with a simple structure.

8 Claims, 18 Drawing Sheets

SEMICONDUCTOR DEVICE AND MANUFACTURING METHOD THEREOF

BACKGROUND OF THE INVENTION

1. Field of The Invention

The present invention relates generally to a semiconductor device formed on an insulating material and a manufacturing method thereof.

2. Description of The Prior Art

In recent years, the high integration of semiconductor integrated circuits, particularly dynamic random access memories (DRAMs), has progressed remarkably. However, the area of a memory cell tends to decrease as the integrated degree thereof increases, so that it is difficult to ensure sufficient cell capacity to prevent so-called soft-error caused by alpha rays radiated from package materials.

Therefore, a semiconductor device has been trying to form on a single crystal silicon film on an insulator film. This semiconductor device is called a Silicon-On-Insulator (SOI) element and promises to serve as a high-performance element which can operate at a high speed and with a low electric power consumption.

As shown in FIG. 15, a SOI MOSFET generally comprises: a semiconductor substrate 62; a buried oxide film 64 formed thereon; a single crystal silicon layer 66 of a first conductivity (e.g., p-type) formed thereon; diffusion layers 76a, 76b of a second conductivity (e.g., n-type) formed in the silicon layer 66 so as to serve as a source and a drain, the second conductivity being different from the first conductivity; a gate oxide film 69 formed on the silicon layer 66; and a gate electrode 70 formed on the gate oxide film 69. Using this SOI element, electron and hole pairs produced by alpha rays can be controlled so as to be located in the single crystal silicon layer (which will be also hereinafter referred to as a "SOI" layer), so that it is possible to greatly improve the soft-error immunity.

However, there are critical drawbacks caused by floating-body effect in that the SOI element (SOI MOSFET) has instabilities that drain breakdown voltage is lowered as shown in FIG. 16 and that the overshoot of output current is caused in switching operation as shown in FIGS. 17A–17F. That is, as shown in FIG. 16, the SOI MOSFET has a lower drain breakdown voltage than that of a MOSFET having the same gate length. In addition, when input voltages (gate pulses) shown in FIGS. 17A, 17C and 17E are applied to the gate electrode, output currents (drain currents) occur as shown in FIGS. 17B, 17D and 17F, respectively. In these output currents, overshoot occurs as shown by arrows in FIGS. 17B, 17D and 17F.

There have been provided methods for effectively preventing carriers produced by the impact ionization, which may cause the floating-body effect in such a SOI element, from accumulating in a channel region (e.g., for effectively preventing holes from accumulating in the case of a MOSFET of n-type SOI structure). For example, the aforementioned methods include: a method for forming a body contact; a method for providing a p-type silicon layer in a diffusion layer to directly connect the silicon layer to a channel region in the case of a n-type Si-MOSFET; and a method for forming, in a source region, a layer of a material (e.g., $Si_{1-x}Ge_x$) having a narrower bandgap than that of a channel region.

However, in the case of the body contact method, there are problems in that the area of a cell increases and that the sheet resistance of the region which connects the body-contact and the channel region can not be ignored as the size decreases. In the case of the method for providing the p-type silicon layer in the source region on the n-MOSFET, it is difficult to form the p-type silicon layer since the $n^+$ layer and the p layer are stacked in the source. Moreover, there are problems in that the sheet resistance may increase, that the thickness of the $n^+$ layer and the p layer can not be accurately controlled unless the heat treatment is suitably controlled, and that although it is desired to cause a hole-absorbing layer to approach a channel region by the lateral diffusion, such control can not be easily performed since the hole-absorbing layer reaches the channel region in some heat treatment conditions. There is also a problem in that it is not possible to prevent the thickness of the SOI layer from increasing in order to realize such a formation, so that it goes against the scale down trend such as the decrease of the SOI thickness for the scale down of the device.

In particular, as shown in FIG. 18A, in a case where a p-type silicon layer 75 is provided below a source region 76a so as to be directly connected to a channel region 66, there are problems in that the source region 76a and a drain region 76b are not symmetrically arranged with respect to a gate, and that it is not possible to apply a MOSFET of the aforementioned SOI structure to a transistor forming a memory cell of a DRAM. Furthermore, the reason why it can not be applied to a DRAM is as follows.

As shown in FIG. 19, a memory cell of a DRAM generally comprises a MOSFET 50 and a capacitor 55. A gate 51 of the MOSFET 50 is connected to a word wire WL, a source 52a is connected to a bit line BL, and a drain 52b is connected to one end of the capacitor 55. Furthermore, the other end of the capacitor 55 is grounded.

When a transistor shown in FIG. 18A is used as a transistor of the aforementioned memory cell, it can be clearly seen from the energy band diagram (see FIG. 18B) of a source region ($p^+$ layer 75), a channel region (p-layer 66) and a drain region ($n^+$ layer 76b) when a source potential is in a high level that electrons flow between the source and drain independent of a gate voltage $V_G$. That is, when writing (when the source potential is in a high level), the control of the gate may be lost to cause the malfunction of the transistor shown in FIG. 18A, so that it is unsuitable for a device such as a DRAM wherein carriers move in both directions.

Thus, in a case where the p-type silicon layer 75 is arranged below the n-type source region 76a so as to be directly connected to the channel, when the source potential is in a high level, the pn junction between the channel region and the drain region is conducted, so that it can not be applied to many MOS devices including DRAMs.

In addition, in the case of the method for forming the region of a narrow-bandgap material in the source region, if the ion implantation is used to form the region of the narrow-bandgap material, the damage caused by the ion implantation into the diffusion layer region may cause problems with respect to the element characteristics.

SUMMARY OF THE INVENTION

It is therefore an object of the present invention to eliminate the aforementioned problems and to provide a semiconductor device which can effectively suppress the floating-body effects with a simple structure, and a manufacturing method thereof.

In order to accomplish the aforementioned and other objects, according to one aspect of the present invention, there is provided a semiconductor device, which comprises:

a first semiconductor layer having a first conductivity formed on a substrate having a surface of an insulating material; a source region and a drain region, which are formed on the first semiconductor layer so as to be separated from each other and which have a second conductivity different from the first conductivity; a channel region formed in the first semiconductor layer between the source region and the drain region; an insulator and a gate electrode formed on the channel region; a gate sidewall of an insulating material formed on a side of the gate electrode; and a second semiconductor layer having the first conductivity formed on at least the source region.

Each of the first and second semiconductor layers may be a single crystal silicon layer. The first semiconductor layer may be a single crystal silicon layer, and the second semiconductor layer may be an alloy layer of silicon and a material having a narrower bandgap than that of silicon. The semiconductor device may further comprise an electrode wiring layer of at least one of a metal or a metal compound, which is formed on the source region so as to contact the source region and so that a side thereof contacts the second semiconductor layer. The semiconductor device may further comprise a silicide layer formed on the second semiconductor layer.

According to another aspect of the present invention, there is provided a method for manufacturing a semiconductor device, which comprises the steps of: forming a gate insulator film on a SOI substrate wherein a first semiconductor layer of silicon having a first conductivity is formed on an insulator; forming a gate electrode on the gate insulator film; forming a gate sidewall of an insulating material on a side of the gate electrode; introducing a dopant into the first semiconductor layer on both sides of the gate electrode to form a source region and a drain region, which have a second conductivity different from the first conductivity; and forming a second semiconductor layer having the first conductivity on at least the source region.

The second semiconductor layer may be a silicon layer which may be formed by the CVD method in which a dopant gas was mixed with si-containing gas (e.g., $SiH_4$ or $Si_2H_6$). The step of forming the second semiconductor layer may comprise the steps of forming a single crystal silicon layer on the source and drain regions, and then, carrying out the ion implantation of a dopant into the single crystal silicon layer. The second semiconductor layer may be a silicon alloy layer of $Si_{1-x}Ge_x$ or $Si_{1-x}Sn_x$, and the second semiconductor layer may be formed by the CVD method. Alternatively, the step of the second semiconductor layer may comprise the steps of forming a single crystal silicon layer on the source and drain regions, and then, carrying out the ion implantation of Ge or Sn into the single crystal silicon layer. In addition, the manufacturing method may further comprise the steps of removing a part of the second semiconductor layer on the source region to expose the source region, and then, forming an electrode wiring layer of at least one of a metal or a metal compound on the source region so as to contact the source region and so that a side of the electrode wiring layer contacts the second semiconductor layer. Moreover, the manufacturing method may include the step of forming a silicide layer on the second semiconductor layer. Alternatively, the step of the second semiconductor layer may comprise the steps of forming a single crystal silicon layer on the source region, and then, doping a dopant into the single crystal silicon layer by irradiating the single crystal silicon layer with a laser in a gas containing an element of the impurity.

According to further aspect of the present invention, there is provided a method for manufacturing a semiconductor device, which comprises the steps of: forming a gate insulator film on a SOI substrate wherein a first semiconductor layer of silicon having a first conductivity is formed on an insulator; forming a gate electrode on the gate insulator film; forming a gate sidewall of an insulating material on a side of the gate electrode; forming a silicon layer on the first semiconductor layer; forming a source region and a drain region on the first semiconductor layer below the silicon layer by carrying out the ion implantation of a dopant of a second conductivity through the silicon layer; and carrying out the ion implantation of a dopant of the first conductivity into the silicon layer.

The manufacturing method may further comprise the steps of removing a part of the silicon layer, into which the ion implantation of the impurity of the first conductivity is carried out, above the source region to expose the source region, and then, forming an electrode wiring layer of at least one of a metal or a metal compound on the source region so as to contact the source region and so that a side of the electrode wiring layer contacts the silicon layer.

DESCRIPTION OF THE PREFERRED EMBODIMENTS

Referring now to the accompanying drawings, the preferred embodiments of a semiconductor device and a method for manufacturing the semiconductor device, according to the present invention, will be described below.

Figure 1:
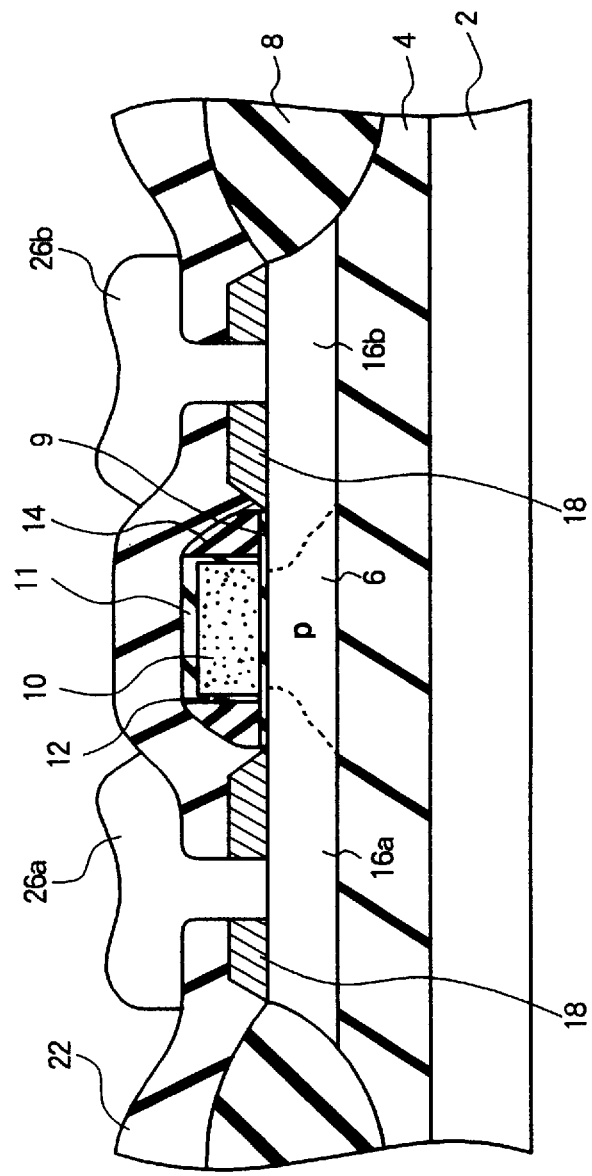
FIG. 1 is a sectional view of the first preferred embodiment of a semiconductor device according to the present invention.

FIG. 1 shows the first preferred embodiment of a semiconductor device according to the present invention. In this preferred embodiment, the semiconductor device is a MOSFET of a SOI structure. In this semiconductor device, a source region 16a and a drain region 16b are formed in a SOI layer 6 formed on an insulator film 4, and single crystal silicon layers 18 having a opposite conductivity from those of the source region 16a and the drain region 16b are formed thereon. That is, in this semiconductor device, for example, an insulator film 4 is formed on a p-type silicon substrate 2, a p-type single crystal silicon layer (SOI layer) 6 is formed on the insulator film 4, and a gate electrode 10 is formed on the SOI layer 6 through a gate insulator film 9. The surface of the gate electrode 10 is covered with an oxide film 12, and the side of the gate electrode 10 is provided with a sidewall 14 of an insulator. In the SOI layer 6, a n-type source region 16a and a n-type drain region 16b, are formed with the gate electrode 10 between them.

On the source region 16a and the drain region 16b, p-type single crystal silicon layers 18 are formed. The single crystal silicon layers 18 and the gate electrode 10 are covered with an interlayer dielectrics 22. The interlayer insulator film 22 and the single crystal silicon layers 18 have contact holes for establishing connects with the source region 16a and the drain region 16b. The source and drain electrodes are connected to metal plugs, are formed so as to be buried in the contact holes. Furthermore, the MOSFET of the aforementioned structure is electrically isolated from other elements by means of an element isolating insulator film 8.

Figure 2:
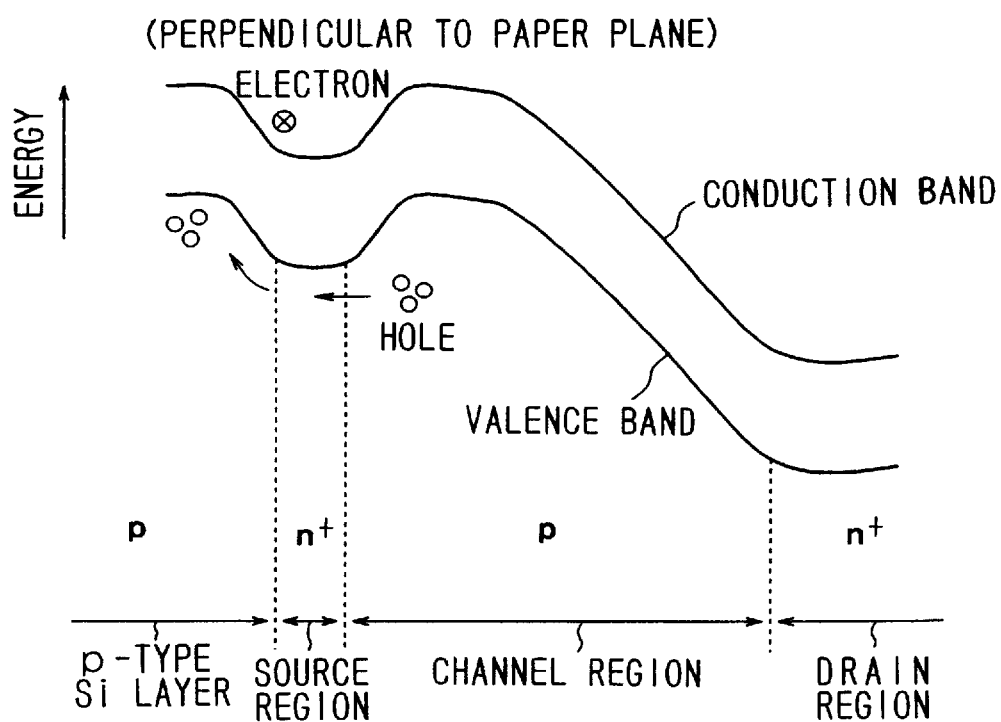
FIG. 2 is a view showing the energy band of the active region of a transistor according to the present invention.

FIG. 2 shows energy bands of a system comprising the p-type single crystal silicon layer 18, the $n^+$ source region 16a, the channel region 6 (the p-type single crystal silicon layer) and the $n^+$ drain region 16b in the first preferred embodiment of a semiconductor device according to the present invention. As can be seen from the energy band diagram of FIG. 2, when the transistor is turned on, excessive holes in the channel region 6 diffuse in the source region 16a. The holes flow into the p-type silicon layer 18 immediately after entering the source region 16a due to the gradient corresponding to a built-in potential between the p-type silicon layer 18 and the $n^+$ diffusion layer (source region) 16a. That is, the silicon layer 18 serves as an "absorbing layer" for absorbing holes to accelerate the hole current from the channel region 6 toward the source 16a. This corresponds to the case that the diffusion length of holes entering the source region 16a is effectively decreased. In this case, the electrons in the source region 16a flow from the source electrode 26a to the drain electrode 26b via the source region 16a and the channel region 6, through the edge portion of the interface with the p-type silicon layer, so that there is no problem in the electric characteristics.

Figure 3:
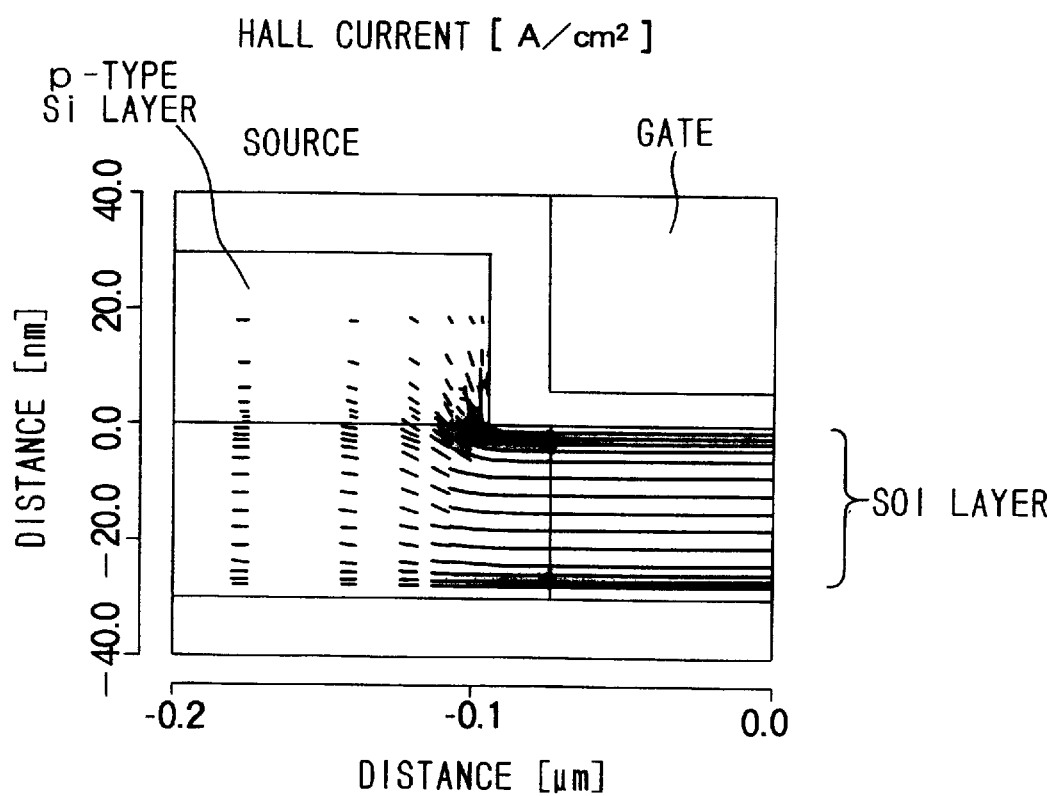
FIG. 3 is a vector diagram showing excessive carriers in a channel region when a semiconductor device of the present invention operates.
Figure 4:
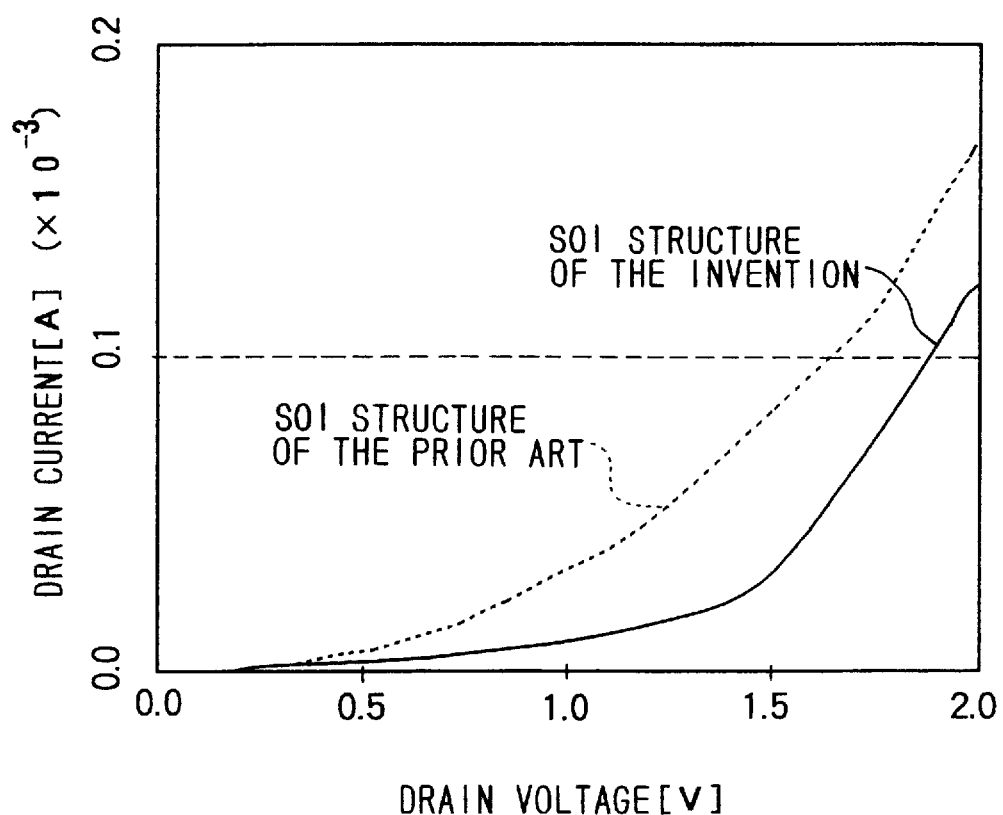
FIG. 4 is a graph explaining the improvement of a drain breakdown voltage of a semiconductor device according to the present invention.

FIG. 3 is a vector diagram showing the simulated flow of carriers (holes in the case of a n-type MOSFET, and electrons in the case of a p-type MOSFET) in the first preferred embodiment of a semiconductor device (MOSFET) according to the present invention. In this simulation, the pn junction of the channel region 6 and the source region 16a is set to be located at the end of the gate 10 in the SOI layer 6. It can be seen from FIG. 3 that excessive carriers (holes) are taken in the p-type silicon layer 18 immediately after diffusing in the source region 16a, consequently, the carriers accumulating in the channel region 6 are discharged to the source region 16a and the floating-body effect is suppressed. This can be understood from the following. FIG. 4 shows the characteristics of drain currents Id and drain voltages Vds of a conventional MOSFET of a SOI structure and the MOSFET in this preferred embodiment when the ratio L/W of the gate length L to the gate width W is 0.15 $\mu$m/0.15 $\mu$m. If Vds is defined as a drain breakdown voltage when 0.1 mA drain current flows, it can be seen from the characteristics shown in FIG. 4 that the drain breakdown voltage of the MOSFET in this preferred embodiment is higher than that of the conventional MOSFET by about 0.3 V, so as to improve the drain breakdown voltage.

As mentioned above, according to the semiconductor device in this preferred embodiment, it is possible to effectively suppress the floating-body effect-with a very simple structure wherein the p-type silicon layers 18 are formed on the source region 16a and the drain region 16b.

In addition, the MOSFET of the SOI structure in this preferred embodiment can be widely applied to DRAMs and so forth since the p-type silicon layers 18 do not contact the channel region.

Moreover, since the MOSFET in this preferred embodiment has a very simple structure as mentioned above, it does not increase the area of a cell if it used for a DRAM. In addition, since the SOI layer 6 is the same as that of the conventional MOSFET, the thickness of the SOI layer 6 can be decreased to achieve the scale down thereof. In addition, it is possible to prevent the damage caused by forming the p-type silicon layers 18 on the diffusion layers 16a, 16b serving as a source and drain, so that it is possible to obtain a good element characteristic.

Furthermore, while the p-type silicon layers 18 have been provided on both of the source region 16a and the drain region 16b in the aforementioned preferred embodiment, it is possible to effectively suppress the floating-body effect if a p-type silicon layer is provided on only the source region 16a.

Referring to FIGS. 5A through 5D, 6A and 6B, the second preferred embodiment of a method for manufacturing a semiconductor device, according to the present invention, will be described below.

According to this preferred embodiment, the semiconductor device shown in FIG. 1 is manufactured. First, oxygen is injected into a p-type silicon substrate 2 having a crystal orientation of (100), at an acceleration voltage of 180 kV and at a dose amount of $2 \times 10^{18} cm^{-2}$ (see FIG. 5A). Subsequently, the heat treatment is carried out at 1300° C. for 5 hours, so that a buried oxide film 4 having a thickness of 400 nm is formed at a depth of 200 nm from the silicon surface (see FIG. 5B). At this time, a single crystal silicon film (also hereinafter referred to as a "SOI" film) 6 is formed on the surface (see FIG. 5B).

Figure 5A:
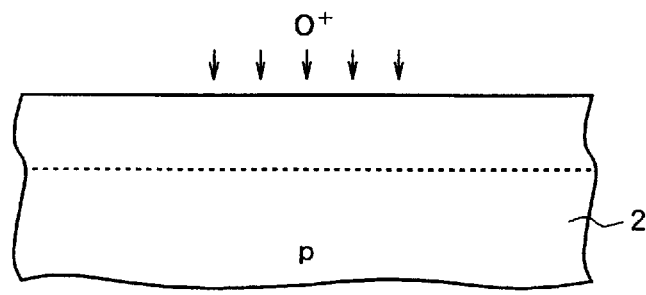
FIGS. 5A through 5D are sectional views showing the steps of the second preferred embodiment of a method for manufacturing a semiconductor device according to the present invention.
Figure 5B:
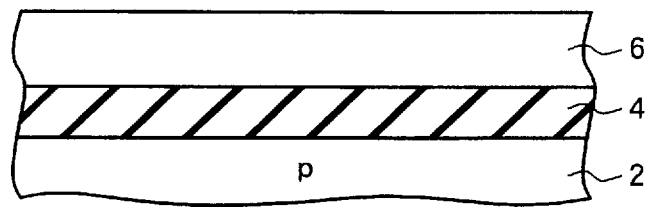
Figure 5C:
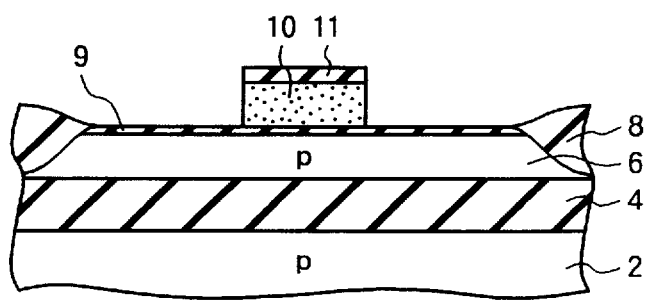

Then, the thickness of the SOI film 6 is decreased to 150 nm by the thermal oxidation and the etching with a $NH_4F$ solution (see FIG. 5C). Subsequently, an oxide film 8 for isolating elements from each other is formed by the selective oxidation technique such as the LOCOS method, so that the adjacent elements are electrically isolated from each other (see FIG. 5C). Thereafter, a gate oxide film 9 having a thickness of 10 nm is formed on the element region. Subsequently, a polysilicon having a thickness of 300 nm, in which phosphorus is doped, is deposited to form thereon a CVD oxide film 11 having a thickness of 100 nm. Thereafter, the patterning is carried out using the photolithography technique to form a gate electrode 10 having a gate length of 0.5 µm and an oxide film cap (see FIG. 5C).

Figure 5D:
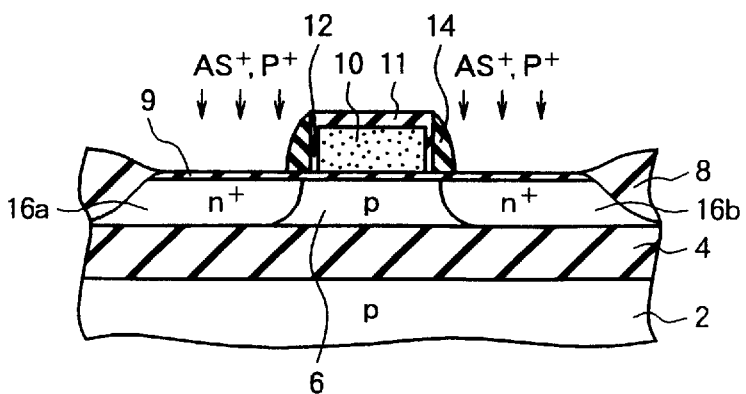

Thereafter, the whole surface is oxidized to form an oxide film 12 having a thickness of 8 nm (see FIG. 5D). Then, a SiN film having a thickness of 20 nm is deposited on the whole surface, and gate sidewalls 14 are formed by carrying out the etch-back of the whole surface using an anisotropic etching (e.g., the Reactive Ion Etching) (see FIG. 5D). As$^+$ ions are injected at an acceleration voltage of 30 kV and at a dose amount of $3 \times 10^{15} cm^{-2}$ using the gate electrode 10 and the gate sidewalls 14 as masks. Thereafter, the annealing is carried out under an atmosphere of nitrogen at a temperature of 800° C. for 30 minutes to form n$^+$ diffusion layers 16a and 16b on the sides of the source and drain regions as shown in FIG. 5D.

Figure 6A:
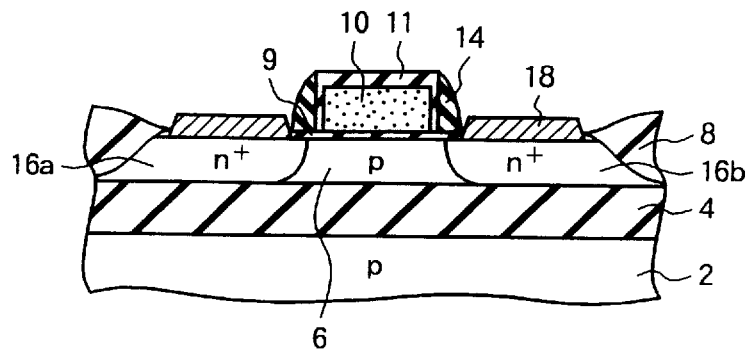
FIGS. 6A and 6B are sectional views showing the steps of the second preferred embodiment of a method for manufacturing a semiconductor device according to the present invention.
Figure 6B:
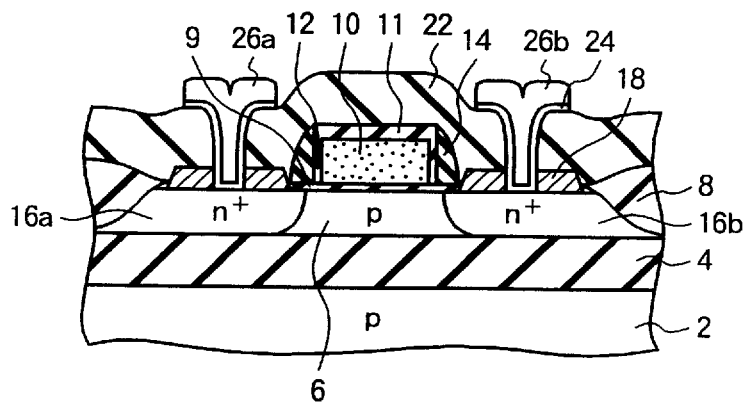

Then, a single crystal silicon film having a thickness of 20 nm is selectively deposited using the gate electrode 10, the oxide film 11 and the gate sidewalls 14 as masks by the CVD method. At this time, $B_2H_6$ ($PH_3$, $AsH_3$) is introduced into the CVD gas to carry out the doping to form a silicon layer 18 having the opposite polarity to those of the diffusion layers 16a, 16b as shown in FIG. 6A.

Then, an interlayer insulator film 22 is deposited on the whole surface using the CVD method, and contact holes passing through the silicon layer 18 having the opposite polarity to those of the diffusion layers 16a, 16b are formed in the interlayer insulator film 22 using the lithography technique. Subsequently, films 24 of a metal serving as a barrier metal or of a metal compound are formed on the bottoms and sides of the contact holes. Thereafter, metal films of an electrode material, such as Al—Si or Al—Si—Cu, are deposited on the whole surface using the sputtering method so as to be buried in the contact holes, and the patterning is carried out to form a source electrode 26a and a drain electrode 26b to complete the manufacturing of a MOSFET (see FIG. 6B). Furthermore, the films 24 of a metal serving as a barrier metal or of a metal compound may be formed by sequentially forming a Ti film and a TiN film on the whole surface, and then, by carrying out the annealing to form the Ti silicide film on the bottoms of the contact holes and on the sides of the through holes of the silicon layers 18. In this case, the Ti film on the sidewalls of the contact holes of the interlayer insulator film 22 are not converted into the silicide.

According to this manufacturing method in the second preferred embodiment, it is possible to effectively suppress the floating-body effect with a very simple structure since the silicon layers 18 having the opposite polarity to those of the diffusion layers 16a, 16b are formed on the diffusion layers 16a, 16b serving as source and drain regions. In addition, it is possible to decrease the diffusion length as compared with that of the conventional devices since the silicon layer 18 having the opposite polarity is formed on the source region.

Moreover, when the p-type silicon layer 18 is formed, it is possible to obtain good element characteristics without damaging the source region 16a and the drain region 16b.

Figure 7:
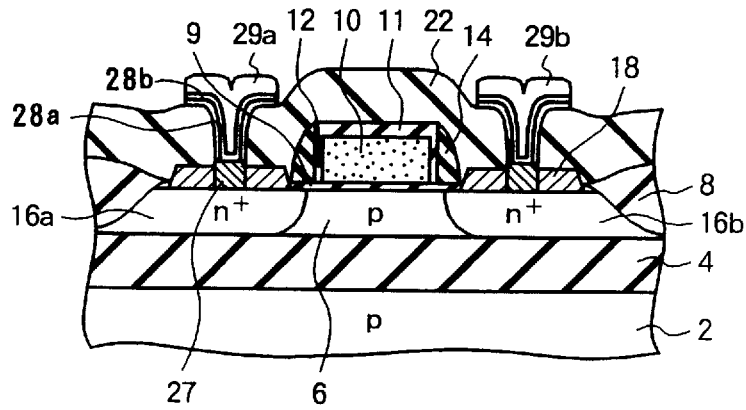
FIG. 7 is a sectional view showing the step of the third preferred embodiment of a method for manufacturing a semiconductor device according to the present invention.

Referring to FIG. 7, the third preferred embodiment of a method for manufacturing a semiconductor device, according to the present invention, will be described below.

In this preferred embodiment, the same steps as those of FIGS. 5A through 5D, 6A and 6B in the second preferred embodiment are carried out until the interlayer insulator film 22 is formed. Subsequently, contact holes are formed so as to extend to the upper surfaces of the p-type silicon layers 18. Then, after a Ti film 28a having a thickness of 20 nm and a TiN film 28b having a thickness of 70 nm are sequentially formed using the sputtering method, the annealing is carried out under an atmosphere of nitrogen at a temperature of 600° C. for 30 minutes to form the portions of the p-type silicon layers 18 just under the contact holes into a $TiSi_2$ layer 27 having a thickness of 40 nm (see FIG. 7). Subsequently, the patterning is carried out to form a source electrode 29a and a drain electrode 29b to complete the manufacturing of a MOSFET (see FIG. 7).

Furthermore, in this preferred embodiment, the Ti films 28a on the sidewalls of the contact holes of the interlayer insulator film 22 are not converted into the silicide.

The manufacturing method in this third preferred embodiment has the same advantages as those in the second preferred embodiment.

Figure 8A:
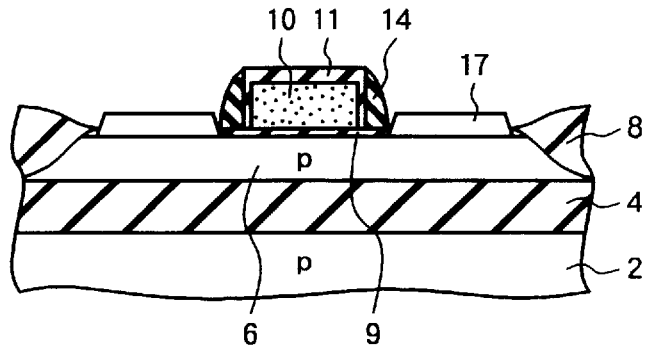
FIGS. 8A through 8C are sectional views showing the steps of the fourth preferred embodiment of a method for manufacturing a semiconductor device according to the present invention.
Figure 8B:
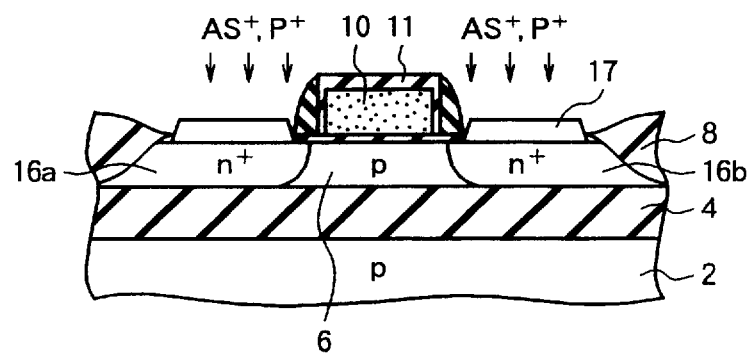
Figure 8C:
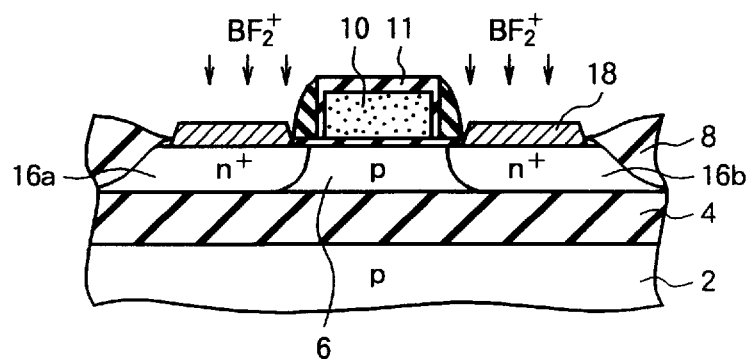

Referring to FIGS. 8A through 8C, the forth preferred embodiment of a method for manufacturing a semiconductor device, according to the present invention, will be described below.

In this preferred embodiment, the ion implantation is used to form diffusion layers 16a, 16b serving as source and drain regions and silicon layers 18 having the opposite polarity. The same steps as those of FIGS. 5A through 5D in the second preferred embodiment are carried out until the gate sidewalls 14 are formed. Thereafter, as shown in FIG. 8A, a single crystal silicon film 17 is epitaxially formed by the CVD method or the like using, as masks, a gate electrode capped with an oxide film 11 and gate sidewalls 14. Then, the ion implantation of As$^+$ is carried out using the gate electrode 10 and the gate sidewalls 14 as masks at an acceleration voltage of ~40 kV and at a dose amount of 3×10$^{15}$cm$^{-2}$ (see FIG. 8B). In addition, the ion implantation of BF$_2^+$ is carried out in appropriate ion implantation conditions (e.g., at an acceleration voltage of 5 kV and at a dose amount of 3×10$^{15}$cm$^{-2}$) as shown in FIG. 8C. Thereafter, the annealing is carried out under an atmosphere of nitrogen in appropriate conditions (e.g., at a temperature of 800° C. for 30 minutes), so that silicon layers 18 having the opposite polarity to those of the diffusion layers 16a, 16b are formed on the diffusion layers 16a, 16b. The order of these two ion implantation steps and the two annealing steps corresponding thereto may be changed. For example, the annealing may be carried out after carrying out the ion implantation of BF$_2^+$, and then, the annealing may be carried out after carrying out the ion implantation of As$^+$.

The manufacturing method in this fourth preferred embodiment has the same advantages as those in the second preferred embodiment.

Figure 9A:
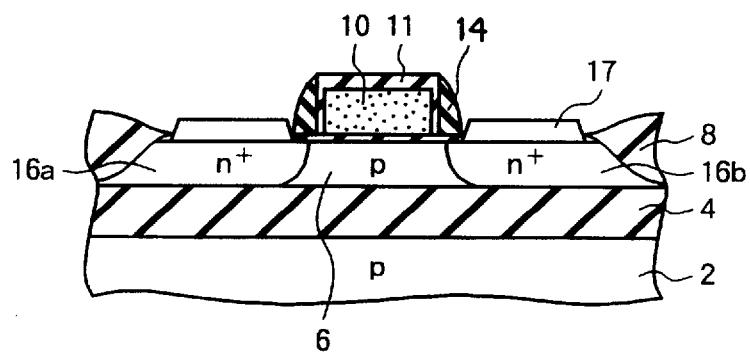
FIGS. 9A and 9B are sectional views showing the steps of the fifth preferred embodiment of a method for manufacturing a semiconductor device according to the present invention.
Figure 9B:
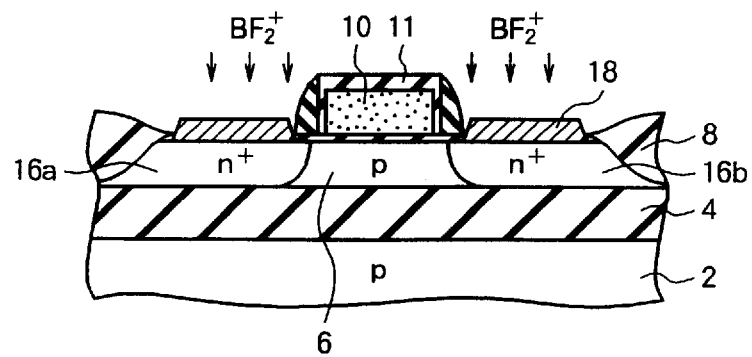

Referring to FIGS. 9A and 9B, the fifth preferred embodiment of a method for manufacturing a semiconductor device, according to the present invention, will be described below.

In this preferred embodiment, diffusion layers 16a, 16b and silicon layers 18 having the opposite polarity are formed by the ion implantation. The same steps as those in the second preferred embodiment are carried out until the diffusion regions 16a, 16b are formed.

After the diffusion layers 16a, 16b are formed, single crystal silicon films 17 are epitaxially formed on the diffusion layers 16a, 16b using the CVD method or the like as shown in FIG. 9A. Subsequently, the ion implantation of BF$_2^+$ is carried out using a gate electrode 10 and gate sidewalls 14 as masks in appropriate ion implantation conditions (e.g., at an acceleration voltage of 5 kV and at a dose amount of 3×10$^{15}$cm$^{-2}$) so that silicon layers 18 having the opposite polarity to those of the diffusion layers 16a, 16b are formed on the diffusion layers 16a, 16b (see FIG. 9B).

The manufacturing method in this preferred embodiment has the same advantages as those in the second preferred embodiment.

Furthermore, the silicon layers having the opposite polarity to those of the diffusion layers 16a, 16b may be formed on the diffusion layers 16a, 16b by irradiating a short wavelength light such as an excimer laser to the silicon layers, which have been formed on the diffusion layers by the CVD method or the like, in a gas containing impurity elements and by carrying out the doping.

For example, the doping of boron or phosphorus may be carried out using argon fluoride (ArF) having a wavelength of 193 nm as a light source of an excimer laser, and using diborane (B$_2$H$_6$) or phosphorus trichloride (PCl$_3$) as a gas.

Figure 10:
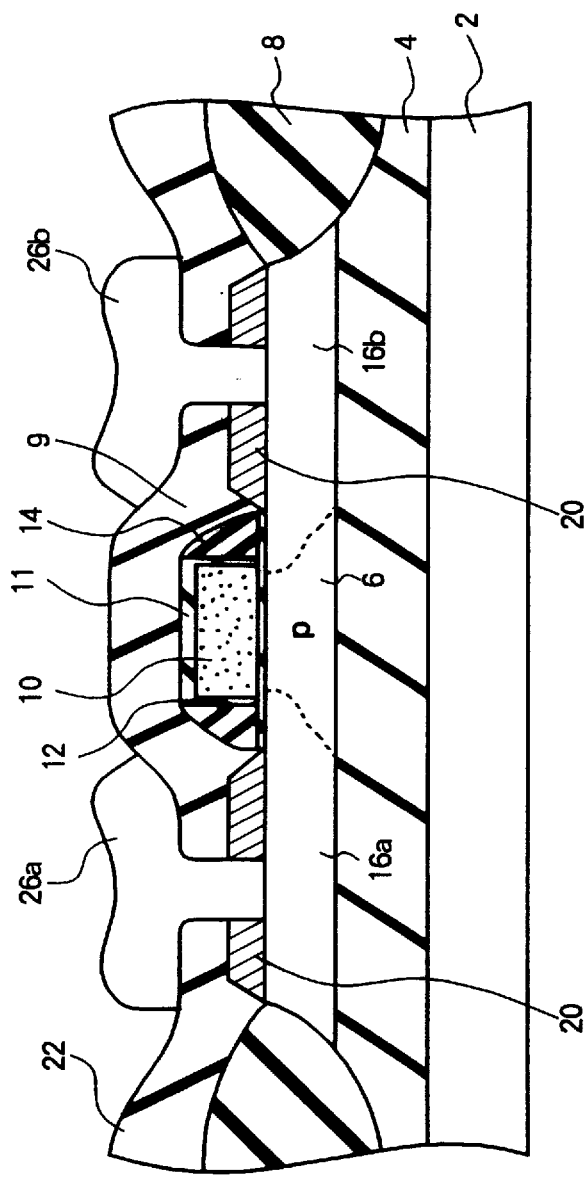
FIG. 10 is a sectional view of the sixth preferred embodiment of a semiconductor device according to the present invention.
Figure 11:
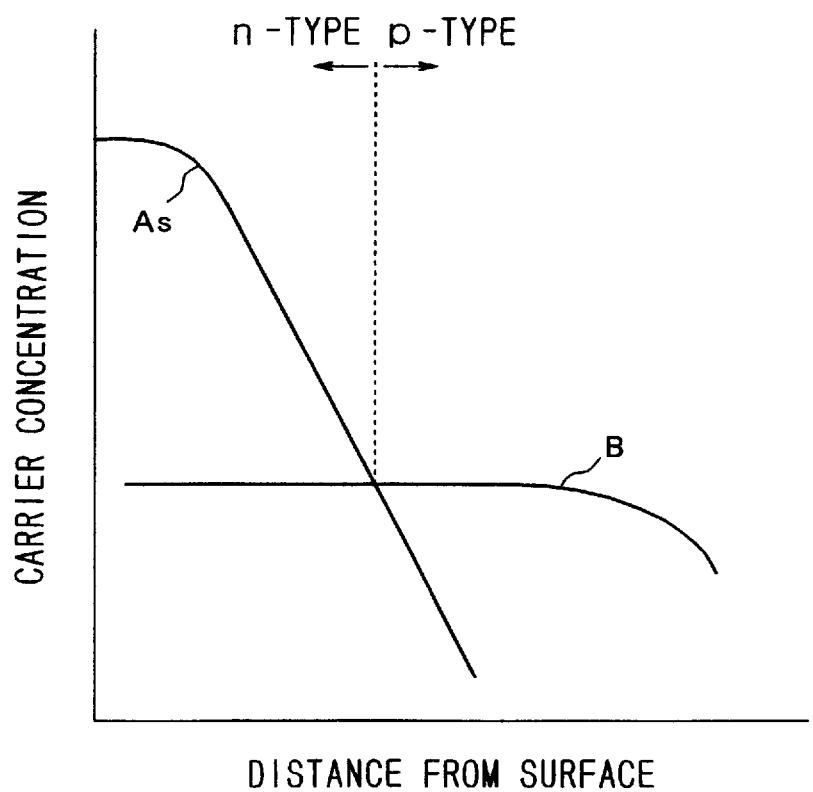
FIG. 11 is a view explaining a metallurgical pn junction.

FIG. 10 shows the sixth preferred embodiment of a semiconductor device according to the present invention. In this preferred embodiment, alloy layers 20, which have the opposite polarity to those of the diffusion layers 16a, 16b and which are alloy layers of silicon mixed with a semiconductor having a narrower bandgap than silicon (e.g., Ge, Sn), are provided in place of the single crystal silicon layers 18 having the opposite polarity to those of the diffusion layers 16a, 16b of the semiconductor device in the first preferred embodiment as shown in FIG. 1.

Thus, since the alloy layers, which have the opposite polarity to those of the diffusion layers 16a, 16b and which are alloy layers of silicon mixed with a material having a narrower bandgap than silicon, are formed on at least the source region, the flow of carriers from the channel region 6 to the source diffusion layer 16a is enhanced, so that it is possible to effectively suppress the floating-body effect and to increase the drain break-down voltage.

In addition, in this preferred embodiment, since the alloy layer 20 is formed on the diffusion layer 16a, the possibility of causing defects or the like in the diffusion layer serving as an active region of transistor can be decreased in comparison with conventional devices wherein the alloy layer is formed in the diffusion layer, and it is possible to prevent the sheet resistance from increasing, so that it is possible to obtain good element characteristics. In addition, since the alloy layer 20 does not contact the channel region 6, the device can be widely applied to DRAMs and so forth.

In this preferred embodiment, if the alloy layer 20 of, e.g., a p-type Si$_{1-x}$Ge$_x$ or Si$_{1-x}$Sn$_x$, is formed so as to be close to the metallurgical pn junction of the source region 16a and the channel region 6, it is possible to achieve a higher drain breakdown voltage. Furthermore, the "metal-lurgical pn junction" means a junction wherein the composition plane is a plane in which the carrier concentration distribution curves of atoms in column V (e.g., As) and atoms in column III (e.g., B) cross each other.

Figure 12A:
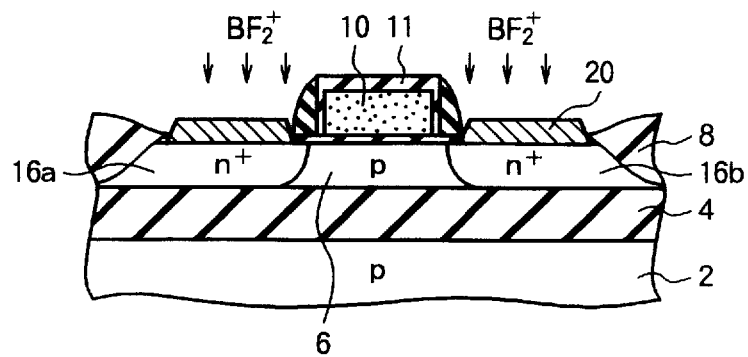
FIGS. 12A and 12B are sectional views showing the steps of the seventh preferred embodiment of a method for manufacturing a semiconductor device according to the present invention.
Figure 12B:
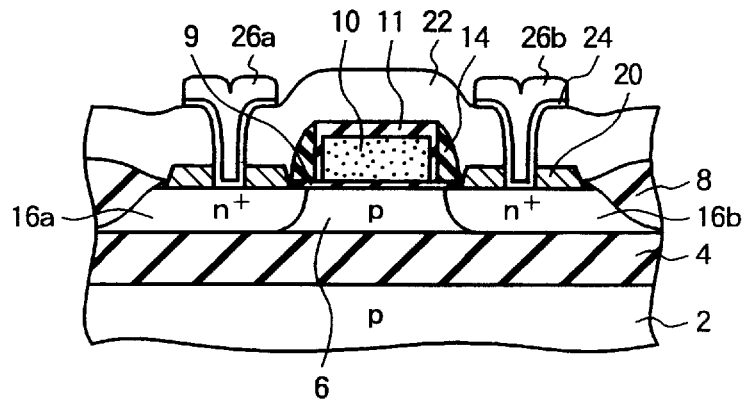

Referring to FIGS. 12A and 12B, the seventh preferred embodiment of a method for manufacturing a semiconductor device, according to the present invention, will be described below. This method is used for manufacturing the sixth preferred embodiment of a semiconductor device according to the present invention.

The same steps as those shown in FIG. 5 in the second preferred embodiment are carried out until the n$^+$ diffusion layers 16a, 16b serving as source and drain regions are formed. After the n$^+$ diffusion layers 16a, 16b are formed, a film of Si$_{0.9}$Ge$_{0.1}$ having a thickness of 20 nm is selectively deposited by the CVD method using, as masks, the gate electrode 10, the oxide film 11 and the gate sidewalls 14 (see FIG. 12A). The deposition is carried out at a growth temperature of 500° to 550° C. in an atmosphere of feed gasses SiH$_4$ and GeH$_4$. At this time, the CVD is carried out by adding B. That is, B$_2$H$_5$ (PH$_3$, AsH$_3$) is introduced into a CVD gas to carry out the doping, so that Si$_{1-x}$Ge$_x$ layers 20 having the opposite polarity to those of the diffusion layers 16a, 16b are formed as shown in FIG. 12A.

Then, after an interlayer insulator film 22 is formed by the CVD method as shown in FIG. 12B, contact holes are formed so as to pass through the Si$_{1-x}$Ge$_x$ alloy layers 20 to the diffusion layers 16a, 16b by the RIE or the like using the photolithography. Subsequently, similar to the manufacturing method in the first preferred embodiment, films 24 of a metal serving as a barrier metal or a metal compound are formed in the contact holes, and a source-side metal electrode 26a and a drain-side metal electrode 26b are formed thereon(see FIG. 12B). In this case, Al—Si, Al—Si—Cu or the like is used as the material of the electrode.

Figure 13:
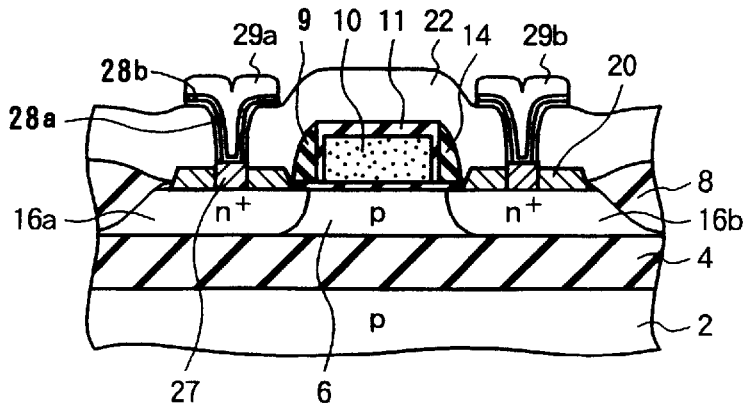
FIG. 13 is a sectional view showing the step of the seventh preferred embodiment of a method for manufacturing a semiconductor device according to the present invention.

Furthermore, with respect to the step of forming the contacts of the Si$_{1-x}$Ge$_x$ layers 20 with both of the diffusion layers 16a, 16b, a silicide layer 27 may be formed by the silicidation so as to pass through the Si—Ge layer 20 to the diffusion layers 16a, 16b after forming the contact holes reaching the upper surface of the Si$_{1-x}$Ge$_x$ layers 20 (see FIG. 13), similar to the manufacturing method in the third preferred embodiment shown in FIG. 7. That is, after forming the contact holes, a Ti film 28a having a thickness of 20 nm and a TiN film 28b having a thickness of 70 nm are sequentially formed. Subsequently, the annealing is carried out at a temperature of 600° C. in an atmosphere of nitrogen for 30 minutes to form the portions of the $Si_{1-x}Ge_x$ layers 20 directly below the contact holes into the silicide layer 27 reaching the diffusion layers 16a, 16b. Thereafter, a source-side metal electrode 29a and a drain-side metal electrode 29b are formed by carrying out the sputtering of Al—Cu.

Figure 14A:
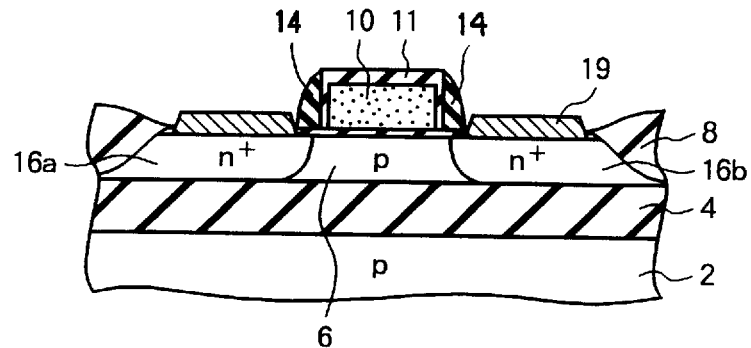
FIGS. 14A through 14C are sectional views showing the steps of the eighth preferred embodiment of a method for manufacturing a semiconductor device according to the present invention.
Figure 14B:
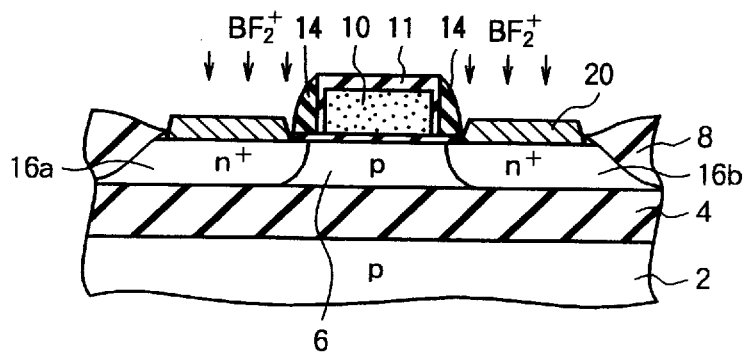
Figure 14C:
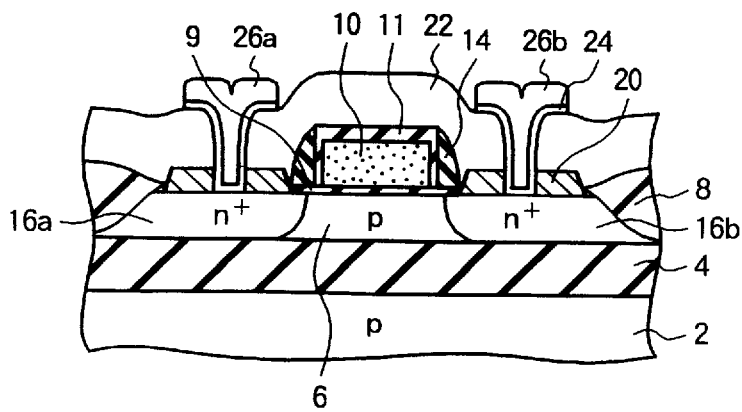
Figure 15:
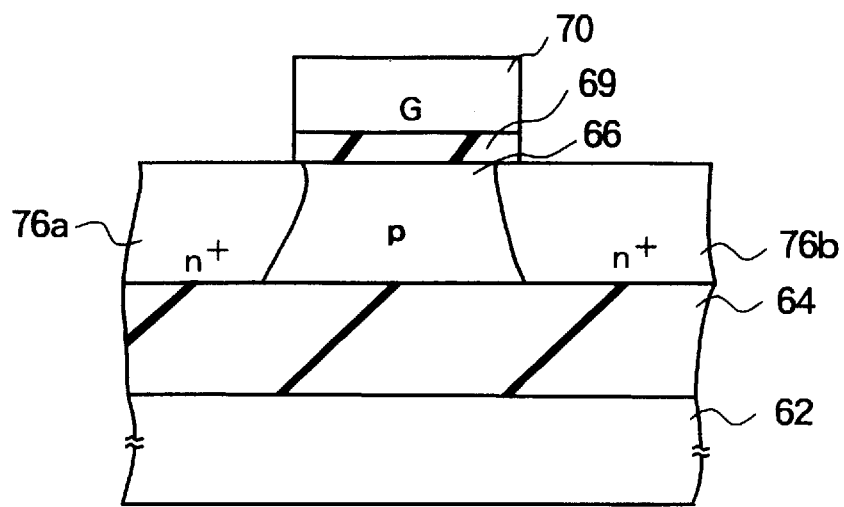
FIG. 15 is a sectional view of the conventional MOSFET in a SOI structure.
Figure 16:
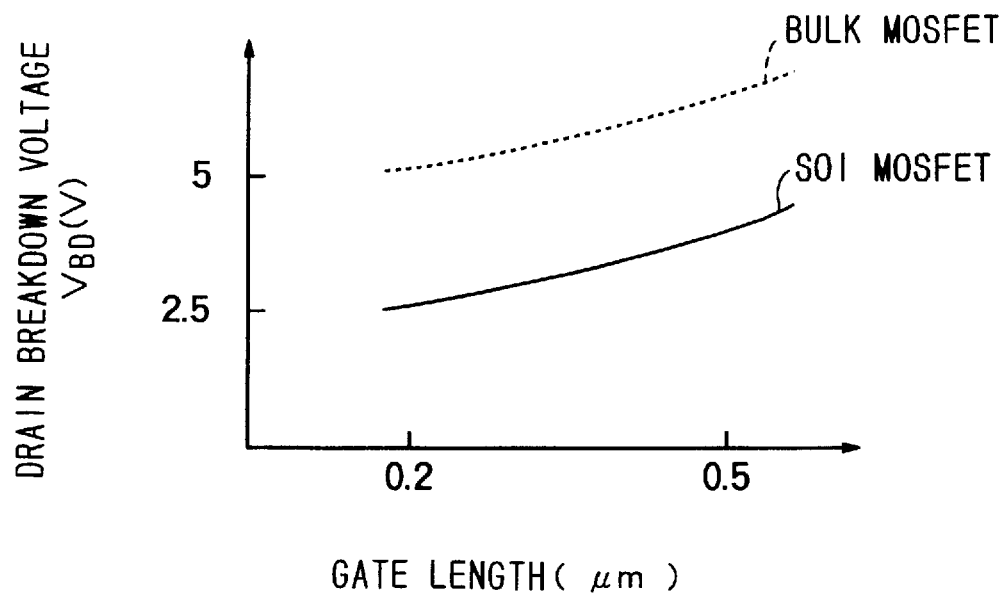
FIG. 16 is a graph showing the characteristics of drain breakdown voltages with respect to gate lengths of a MOSFET of a bulk structure and a MOSFET of a SOI structure.
Figure 17A:
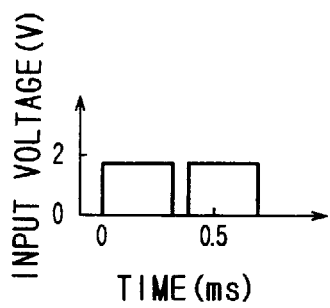
FIGS. 17A through 17F are views explaining the overshoot of output currents in the switching operation of a conventional MOSFET of a SOI structure.
Figure 17B:
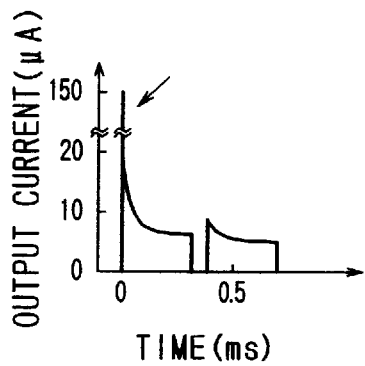
Figure 17C:
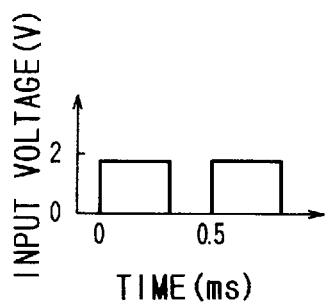
Figure 17D:
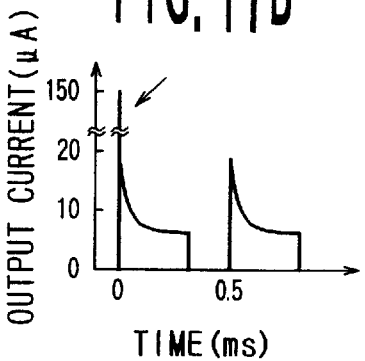
Figure 17E:
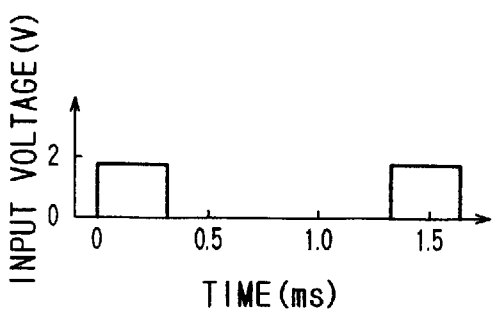
Figure 17F:
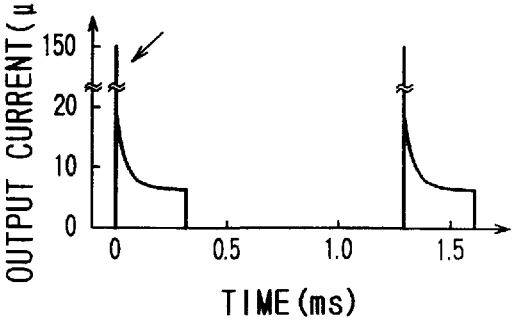
Figure 18A:
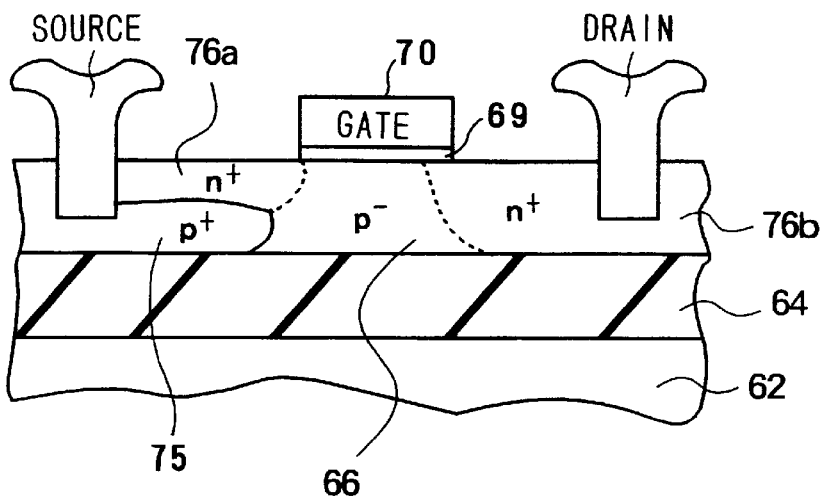
FIG. 18A is a sectional view of the conventional MOSFET in a SOI structure having a dual source.
Figure 18B:
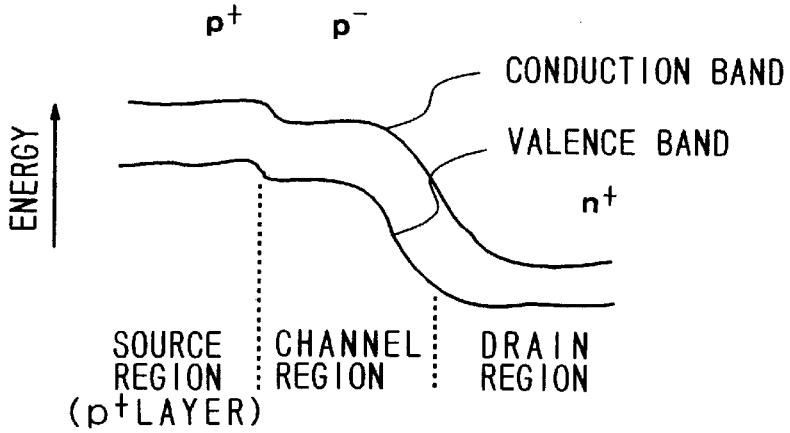
FIG. 18B is a view showing the energy band of the MOSFET of FIG. 18A.
Figure 19:
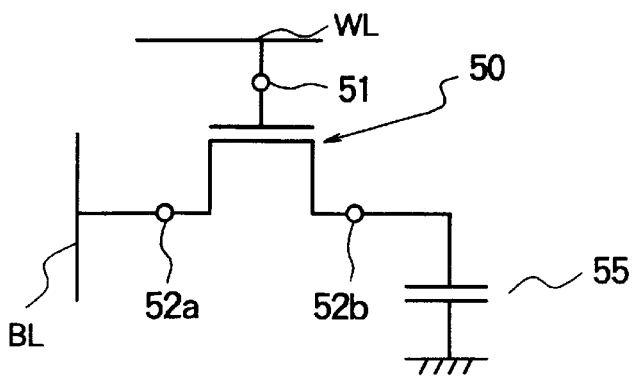
FIG. 19 is a circuit diagram of a memory cell of a DRAM.

The doping into the $Si_{1-x}Ge_x$ layers 20 formed on the diffusion layers 16a, 16b may be carried out by the ion implantation similar to the manufacturing method in the fifth preferred embodiment. Referring to FIGS. 14A through 14C, the eighth preferred embodiment of a manufacturing method, wherein the doping is carried out by the ion implantation, according to the present invention, will be described below.

The same steps as those in the fifth preferred embodiment are carried out until diffusion layers 16a, 16b serving as source and drain regions are formed. After forming the diffusion layers 16a, 16b, a film of $Si_{0.9}Ge_{0.1}$ having a thickness of 20 nm is selectively deposited by the CVD method using, as masks, a gate electrode 10, an oxide film 11 and gate sidewalls 14 (see FIG. 14A). The deposition was carried out at a growth temperature of 500° to 550° C. in an atmosphere of feed gases $SiH_4$ and $GeH_4$. $Si_2H_6$ or $SiH_2Cl_2$ may be substituted for $SiH_4$, and $GeH_2Cl_2$ may be substituted for $GeH_4$. In particular, when the deposition is carried out for 8 minutes using $Si_2H_6$ and $GeH_4$ at a gas pressure of $5\times10^{-2}$ Pa in the growth chamber of the CVD device, $Si_{1-x}Ge_x$ layers 19 having a thickness of 20 nm can be selectively formed as shown in FIG. 14A.

Then, the ion implantation of $BF_2^+$ is carried out at appropriate ion implantation conditions (e.g., at an acceleration voltage of 5 kV and at a dose amount of $3\times10^{15} cm^{-2}$) using the gate electrode 10 and the gate sidewalls 14 as masks, and the annealing is carried out, so that alloy layers 20 having the opposite polarity to those of the diffusion layers 16a, 16b are formed as shown in FIG. 14B.

Subsequently, as shown in FIG. 14C, after depositing an interlayer isolating film on the whole surface, metal films 24 serving as barrier metals are formed on the bottom and sides of the contact holes, and films of an electrode material are deposited by the sputtering method. Then, the patterning is carried out to form a source electrode 26a and a drain electrode 26b.

The manufacturing method in the eighth preferred embodiment has the same advantages as those in the second preferred embodiment.

Furthermore, in this preferred embodiment, it is possible to enhance the drawing of excessive holes by increasing the dose amount in the ion implantation of $BF_2$ serving to form the alloy layer 20 having the opposite polarity. In addition, on the merits of the CVD method, the Ge composition of the Si—Ge film can be changed to a greater extent than in the case of the ion implantation. In particular, in a case where a $Si_{1-x}Ge_x$ (X=0.4) layer having a thickness of about 30 nm is formed, the growth conditions by the LPCVD method include that the substrate temperature is 470° C. and the gas pressures of feed gases $GeH_4$ and $Si_2H_6$ are $1.5\times10^{-2}$ Pa and $1.8\times10^{-2}$ Pa, respectively. In this case, the growth rate is 1 nm/min.

Figure 20:
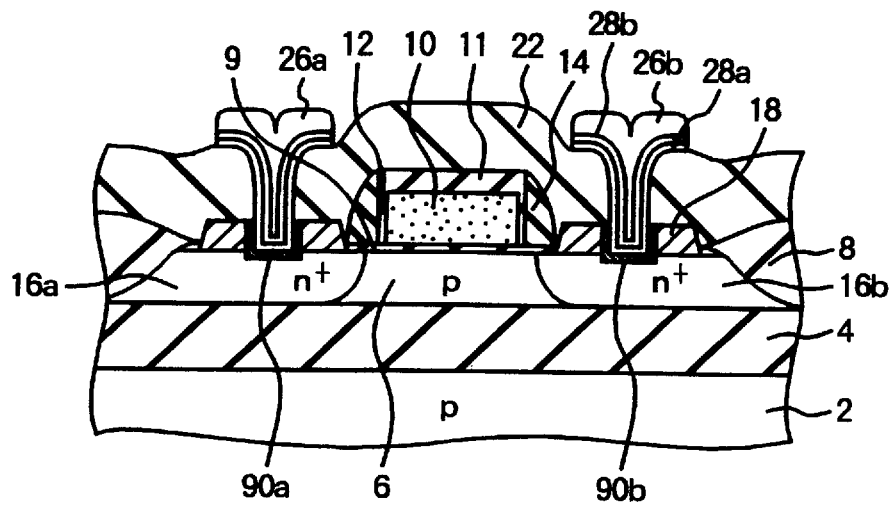
FIG. 20 is a sectional view showing the step of the ninth preferred embodiment of a method for manufacturing a semiconductor device according to the present invention.

Referring to FIG. 20, the ninth preferred embodiment of a method for manufacturing a semiconductor device, according to the present invention, will be described below. The same steps as those of FIGS. 5A through 5D are carried out until contact holes reaching diffusion layers 16a, 16b are formed. Thereafter, a Ti film 28a and a TiN film 28b are formed on the whole surface, and the annealing is carried out to form the portions of the Ti film 28a on the bottoms of the contact holes and on the sides of the through holes of the silicon layer 28 into silicide layers 90a, 90b. At this time, the portions of the Ti film 28a at the sidewalls of the contact holes of the interlayer insulator film 22 are not formed the silicide. Therefore, a source-side metal electrode 26a and a drain-side metal electrode 26b are formed.

The manufacturing method in this ninth preferred embodiment has the same advantages as those in the second preferred embodiment.

Figure 21:
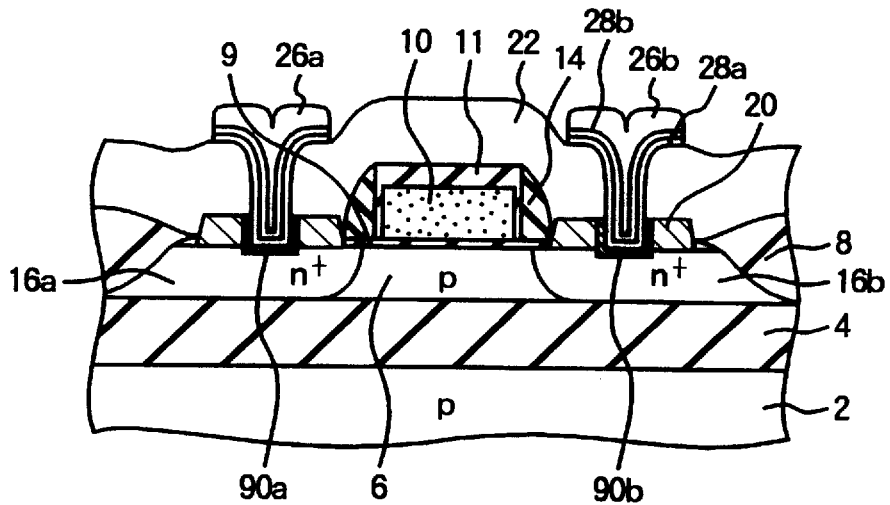
FIG. 21 is a sectional view showing the step of the tenth preferred embodiment of a method for manufacturing a semiconductor device according to the present invention.

Referring to FIG. 21, the tenth preferred embodiment of a method for manufacturing a semiconductor device, according to the present invention, will be described below.

In this preferred embodiment, the same steps as those of FIGS. 12A and 12B in the seventh preferred embodiment and FIGS. 14A through 14C in the eighth preferred embodiment are carried out until the contact holes reaching the diffusion layers 16a and 16b are formed. Thereafter, a Ti film 28a and a TiN film 28b are sequentially formed on the whole surface, and then, the annealing is carried out to convert the portions of the Ti film 28a on the bottoms of the contact holes and on the sides of the through holes of $Si_{1-x}Ge_x$ layer 20, into silicide layers 90a and 90b. At this time, similar to the seventh preferred embodiment, the portions of the Ti film 28a on the sidewalls of the contact holes of the interlayer insulator film 22 are not converted into the silicide. Thereafter, a source-side metal electrode 26a and a drain-side metal electrode 26b are formed to complete the manufacturing of a MOSFET.

The manufacturing method in this tenth preferred embodiment has the same advantages as those in the seventh and eight preferred embodiments.

Furthermore, in the ninth and tenth preferred embodiments, the unreacted portions of the Ti film 28a and the TiN film 28b on the sidewalls of the contact holes of the interlayer insulator film 22 may be removed before forming the metal electrodes 26a and 26b.

Figure 22:
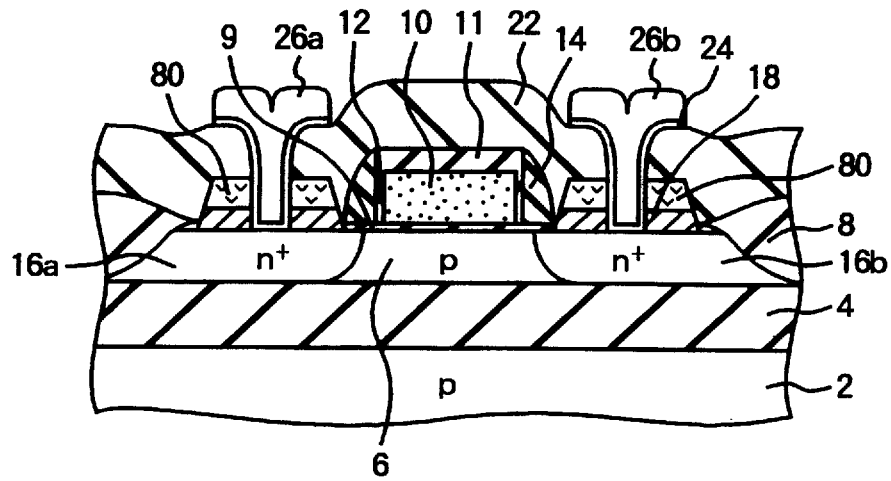
FIG. 22 is a sectional view showing the step of the eleventh preferred embodiment of a method for manufacturing a semiconductor device according to the present invention.

Referring to FIG. 22, the eleventh preferred embodiment of a method for manufacturing a semiconductor device, according to the present invention, will be described below.

The same steps as those of FIGS. 5A through 5D in the second preferred embodiment are carried out until the silicon layers 18 having the opposite polarity to those of the diffusion layers 16a and 16b are formed. At this time, the silicon layers 18 having a thickness of, e.g., 45 nm, are formed on the diffusion layers 16a and 16b. Thereafter, a Ti film having a thickness of, e.g., 25 nm, is formed, and then, a TiN film is formed and the annealing is carried out at a high temperature. By this salicide (self-aligned silicide) step, only the Ti film formed on the silicon layers 18 is formed to be converted into a silicide layer 80 having a thickness of about 50 nm. Thus, the thickness of the silicon layer 18 is decreased to 20 nm. Thereafter, the TiN film and the unreacted Ti film are removed, and then, an interlayer insulator film 22 is deposited on the whole surface. Then, contact holes reaching the diffusion layers 16a and 16b are formed in the interlayer insulator film 22. Subsequently, films 24 of a metal serving as a barrier metal or a metal compound are formed on the bottoms and sides of the contact holes. Then, a metal film of an electrode material, e.g., Al—Si or Al—Si—Cu, is formed on the whole surface by the sputtering method so as to be buried in the contact holes, and then, the patterning is carried out to form a source electrode 26a and a drain electrode 26b.

In this eleventh preferred embodiment, since the silicide layer 80 is formed on the silicon layer 18, it is possible to achieve a lower parasitic resistance than that in the second preferred embodiment to improve the transistor operation. In addition, the drawing of excessive carriers into the electrode can be easily carried out, consequently, floating-body effect can be suppressed more effectively.

Figure 23:
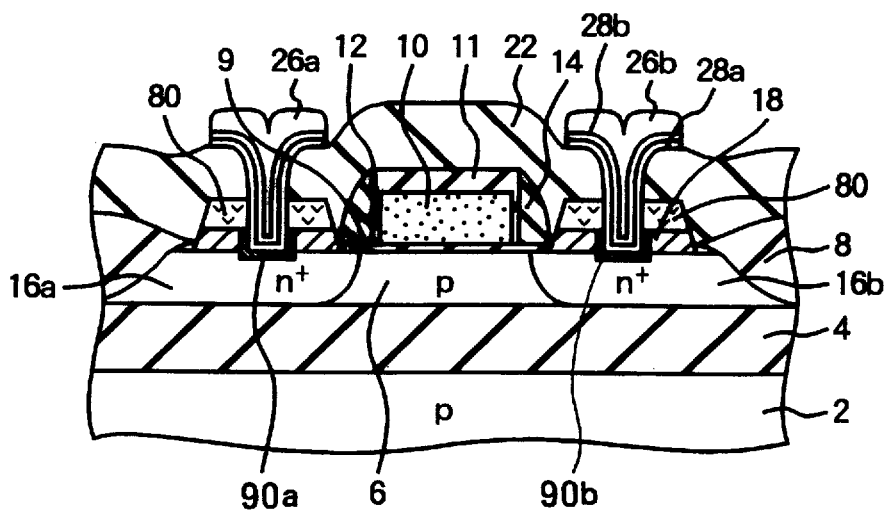
FIG. 23 is a sectional view showing the step of the twelfth preferred embodiment of a method for manufacturing a semiconductor device according to the present invention.

Referring to FIGS. 23, the twelfth preferred embodiment of a method for manufacturing a semiconductor device, according to the present invention, will be described below.

The same steps as those of FIG. 22 in the eleventh preferred embodiment are carried out until the contact holes are formed in the interlayer insulator film 22. Thereafter, a Ti film and a TiN film are sequentially formed on the bottoms and sides of the contact holes, and then, the annealing is carried out, e.g., at a temperature of 600° C. in an atmosphere of nitrogen for 30 minutes, so that the portions of the Ti film 28a on the bottoms of the contact holes and on the sides of the through holes of the silicon layers 18 are formed silicide layers 90a and 90b of $TiSi_2$. Subsequently, metal films of an electrode material, e.g., Al—Si or Al—Si—Cu, are deposited on the whole surface by the sputtering method so as to be buried in the contact holes, and then, the patterning is carried out to form a source electrode 26a and a drain electrode 26b.

The manufacturing method in this twelfth preferred embodiment has the same advantages as those in the eleventh preferred embodiment.

Figure 24:
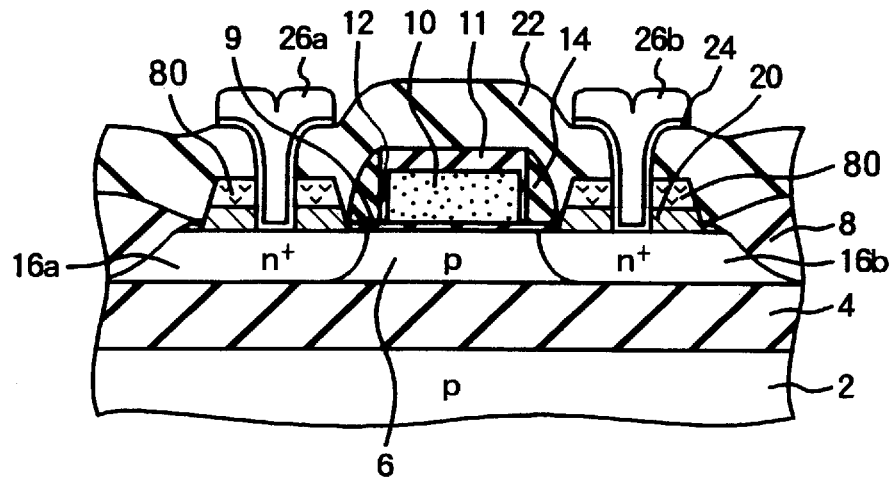
FIG. 24 is a sectional view showing the step of the thirteenth preferred embodiment of a method for manufacturing a semiconductor device according to the present invention.

Referring to FIG. 24, the thirteenth preferred embodiment of a method for manufacturing a semiconductor device, according to the present invention, will be described below.

The same steps as those of FIGS. 12A and 12B in the seventh preferred embodiment are carried out until the alloy layers 20, which have the opposite polarity to those of the diffusion layers 16a, 16b and which are alloy layers of silicon mixed with a semiconductor (e.g., Ge, Sn) having a narrower bandgap than silicon, are formed. In this case, the alloy layers 20 having a thickness, e.g., 45 nm, are formed on the diffusion layers 16a and 16b. Thereafter, a Ti film having a thickness of, e.g., 25 nm, is formed on the whole surface, and then, a TiN film is formed. Then, the annealing is carried out at a high temperature, so that only the Ti film on the alloy layer 20 is formed to be converted into a silicide layer 80 having a thickness of about 50 nm. Thus, the thickness of the alloy layer 20 is decreased to 20 nm. Thereafter, the TiN film and the unreacted Ti film are removed, and then, an interlayer insulator film 22 is deposited on the whole surface. Then, contact holes reaching the diffusion layers 16a and 16b are formed in the interlayer insulator film 22. Subsequently, films 24 of a metal serving as a barrier metal or a metal compound are formed on the bottoms and sides of the contact holes. Thereafter, the sputtering is carried out to form metal films of an electrode material, e.g., Al—Si or Al—Si—Cu, on the whole surface so as to be buried in the contact holes, and the patterning is carried out to form a source electrode 26a and a drain electrode 26b.

In this preferred embodiment, since the silicide layers 80 are formed on the alloy layers 20, it is possible to achieve a lower parasitic resistance than that in the seventh preferred embodiment, and it is possible to more effectively suppress the floating-body effect.

Figure 25:
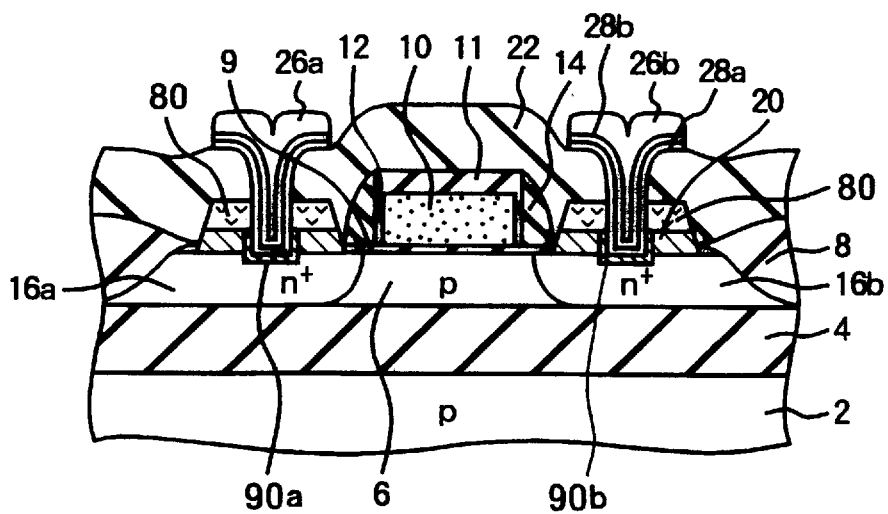
FIG. 25 is a sectional view showing the step of the fourteenth preferred embodiment of a method for manufacturing a semiconductor device according to the present invention.

Referring to FIG. 25, the fourteenth preferred embodiment of a method for manufacturing a semiconductor device, according to the present invention, will be described below.

The same steps as those of the thirteenth preferred embodiment shown in FIG. 24 are carried out until the contact holes are formed in the interlayer insulator film 22. Thereafter, a Ti film and a TiN film are sequentially formed on the bottoms and sides of the contact holes, and the annealing is carried out, e.g., at a temperature of 600° C. in an atmosphere of nitrogen for 30 minutes, so that the portions of the Ti film 28a on the bottoms of the contact holes and on the sides of the through holes of the alloy layers 20 are converted into silicide layers 90a and 90b of $TiSi_2$. Subsequently, the sputtering is carried out to cause metal films of an electrode material, e.g., Al—Si or Al—Si—Cu, to be deposited on the whole surface so as to be buried in the contact holes. Then, the patterning is carried out to form a source electrode 26a and a drain electrode 26b.

This manufacturing method in the fourteenth preferred embodiment has the same advantages as those in the thirteenth preferred embodiment.

Furthermore, in the third through fifth, seventh and eighth preferred embodiments, the silicide layer may be formed on the silicon layers 18 or the $Si_{1-x}Ge_x$ layers 20. In this case, the thickness of the silicide layer should be at least 10 nm.

Furthermore, while the n-MOSFET has been used in the aforementioned first through fourteenth preferred embodiments, p-MOSFET may be used.

As mentioned above, according to the present invention, it is possible to effectively suppress the floating-body effect with a simple structure.

What is claimed is:

1. A semiconductor device comprising:
    a first semiconductor layer having a first conductivity formed on a substrate having a surface of an insulating material;
    a source region and a drain region, which are formed in the first semiconductor layer so as to be separated from each other and which have a second conductivity different from the first conductivity;
    a channel region formed in the first semiconductor layer between the source region and the drain region;
    a gate insulating film formed on the channel region;
    a gate electrode formed on the gate insulating film; and
    a second semiconductor layer having the first conductivity formed on at least the source region so as to be isolated from the gate electrode.

2. The semiconductor device according to claim 1, which further comprises an electrode wiring layer of at least one of a metal or a metal compound, said electrode wiring layer being formed on said source region so as to contact said source region, and a side of said electrode wiring layer contacting said second semiconductor layer.

3. The semiconductor device according to claim 1, wherein each of said first and second semiconductor layers is a single crystal silicon layer.

4. The semiconductor device according to claim 3, which further comprises a silicide layer formed on said second semiconductor layer.

5. The semiconductor device according to claim 1, wherein said first semiconductor layer is a single crystal silicon layer, and said second semiconductor layer is an alloy layer of silicon mixed with a material having a narrower bandgap than silicon.

6. The semiconductor device according to claim 5, which further comprises a silicide layer formed on said second semiconductor layer.

7. The semiconductor device according to claim 1, further comprising a gate sidewall of an insulating material formed on a side of the gate electrode, the gate sidewall electrically insulating the second semiconductor layer from the gate electrode.

8. The semiconductor device according to claim 1, wherein the second semiconductor layer is on the first semiconductor layer.

* * * * *